United States Patent

Dairi

(10) Patent No.: US 6,515,526 B2
(45) Date of Patent: Feb. 4, 2003

(54) PHASE FLUCTUATION GENERATION

(75) Inventor: Kenji Dairi, Tokyo (JP)

(73) Assignee: Ando Electric Co., Ltd., Tokyo (JP)

( * ) Notice: Subject to any disclaimer, the term of this patent is extended or adjusted under 35 U.S.C. 154(b) by 0 days.

(21) Appl. No.: 09/902,951

(22) Filed: Jul. 11, 2001

(65) Prior Publication Data

US 2002/0070778 A1 Jun. 13, 2002

Related U.S. Application Data

(63) Continuation-in-part of application No. 09/550,940, filed on Apr. 17, 2000.

(30) Foreign Application Priority Data

Apr. 26, 1999 (JP) ............................................ 11-118727

(51) Int. Cl.[7] ................................................ H03L 7/06
(52) U.S. Cl. ...................................... 327/156; 327/147
(58) Field of Search ................................ 327/146, 147, 327/150, 155, 156, 159, 160; 331/1 A, 17; 375/376

(56) References Cited

U.S. PATENT DOCUMENTS

| | | | |
|---|---|---|---|
| 5,781,054 A | * | 7/1998 | Lee .............................. 327/231 |
| 5,808,493 A | | 9/1998 | Akiyama et al. ............ 327/156 |
| 5,999,024 A | | 12/1999 | Kang ............................ 327/156 |
| 6,329,850 B1 | * | 12/2001 | Mair et al. .................... 327/105 |
| 6,356,122 B2 | * | 3/2002 | Sevalia et al. ............... 327/105 |
| 6,441,655 B1 | * | 8/2002 | Fallahi et al. ................ 327/115 |

FOREIGN PATENT DOCUMENTS

| | | |
|---|---|---|
| GB | 2 073 515 A | 10/1981 |
| GB | 2 261 780 A | 5/1993 |
| GB | 2 344 006 A | 5/2000 |

* cited by examiner

Primary Examiner—Terry D. Cunningham
Assistant Examiner—Quan Tra
(74) Attorney, Agent, or Firm—Fish & Richardson P.C.

(57) ABSTRACT

A phase fluctuation generation circuit includes a phase detection circuit for detecting a phase difference between a reference clock signal and a fed-back clock signal and outputting a phase difference signal. A conversion circuit is provided for converting the phase difference signal output from the phase detection circuit into a predetermined voltage signal. A voltage-controlled oscillation circuit outputs a clock signal of a predetermined oscillation frequency in response to a voltage value of the voltage signal output from the conversion circuit. A modulated signal generation circuit generates a modulation control signal to fluctuate a phase of the fed-back clock signal. A dividing circuit operating at clock timing of the clock signal output from the voltage-controlled oscillation circuit multiplexes the modulation control signal output from the modulated signal generation circuit and outputs the fed-back clock signal to the phase detection circuit.

5 Claims, 4 Drawing Sheets

PHASE FLUCTUATION GENERATION

CROSS REFERENCE TO RELATED APPLICATIONS

This application is a continuation-in-part of U.S. Ser. No. 09/550,940, filed on Apr. 17, 2000.

BACKGROUND OF THE INVENTION

1. Field of the Invention

This invention relates to phase fluctuation generation that can be used, for example, for measuring the transmission quality in a transmission apparatus or a trunk network adaptable to a high-speed digital communication system.

2. Description of the Related Art

In recent years, development of communication technologies to support speeding up transmission and a large transmission capacity has become an urgent necessity with a surge in demand for information communications. Establishment of a measurement technique for evaluating such communication technologies is also demanded. As measurement for evaluating the transmission quality in a transmission system of a transmission apparatus, a trunk network, etc., adaptable to a high-speed digital communication system, phase difference measurement is executed for detecting jitter (high-frequency component) and wander (low-frequency component) of phase fluctuation components occurring in the transmission system.

To evaluate the clock system of each apparatus of the transmission apparatus, the trunk network, etc., used with the transmission system adaptable to the high-speed digital communication system, phase fluctuation needs to be given to a transmission data signal input to the apparatus whose clock system is to be measured; hitherto, a phase-locked loop (PLL) circuit has been used to give the jitter or wander of phase fluctuation to a transmission clock signal for generating the transmission data signal.

FIG. 6 shows a circuit configuration example of a phase fluctuation generation circuit 100 for giving phase fluctuation with PLL circuits in a related art. In the phase fluctuation generation circuit 100 shown in FIG. 6, a PLL circuit 101 at the first stage multiplies the frequency of a 32-kHz (kilohertz) input signal by 270 and outputs a 8.64-MHz (megahertz) signal and a PLL circuit 102 at the second stage multiplies the frequency of the 8.64-MHz signal input from the PLL circuit 101 by 288 and outputs a 2488.32-MHz signal.

A circuit configuration for giving phase fluctuation to the 2488.32-MHz output signal is contained in the PLL circuit 101. FIG. 7 shows the circuit configuration. The PLL circuit 101 shown in FIG. 7 is made up of a phase detector (PD) 111, a loop filter circuit 114 consisting of an addition circuit 112 comprising resistors R1 and R2 and an inverting amplifier 113 with a resistor R3 and a capacitor C1 connected, a voltage-controlled oscillator (VCO) 115, and a divider 116.

The phase detector (PD) 111 detects a phase difference between an input signal (32 KHz) used as a reference signal and a division signal input from the divider 116 and outputs a phase difference signal of the pulse width corresponding to the phase difference to the loop filter circuit 114. If a phase fluctuation signal (modulated signal with sine wave) is not input to the resistor R2, the loop filter circuit 114 inverts and amplifies the phase difference signal input via the resistor R1 and outputs the signal to the voltage-controlled oscillator 115, which then maintains the frequency of an output signal at 8.64 MHz in response to voltage fluctuation of the inverted and amplified signal input from the inverting amplifier 113. That is, the PLL circuit 101 also outputs the output signal of the voltage-controlled oscillator 115 to the divider 116 and feeds a division signal provided by dividing the output signal of the voltage-controlled oscillator 115 by 270 into the phase detector 116, thereby always correcting the phase fluctuation component for maintaining the frequency of the output signal constant.

In the loop filter circuit 114, if a phase fluctuation signal (modulated signal with sine wave) is input to the resistor R2, the voltage amplitude at the input time is added to the voltage provided by integrating the phase difference signal input to the resistor R1 as phase component and the result is output from the inverting amplifier 113 for fluctuating the output frequency of the voltage-controlled oscillator 115. Output of the voltage-controlled oscillator 115 is divided by 270 by the divider 116 and the result is fed back into the phase detector 111, whereby the phase difference signal input to the resistor R1 operates the PLL circuit 101 so as to cancel the voltage input to the resistor R2. Consequently, the phase difference between the reference clock signal and the fed-back clock signal input to the phase detector 111 becomes a value proportional to the voltage input to the resistor R2, thus an output signal containing the phase difference controlled at the voltage input to the resistor R2 is output from the voltage-controlled oscillator 115.

The configuration of the PLL circuit 101 enables the phase fluctuation generation circuit 100 to generate wander in the output signal.

However, since the phase fluctuation generation circuit 100 comprising the PLL circuits in the related art is of the circuit configuration for adding phase fluctuation for generating wander by the analog addition circuit contained in the loop filter circuit 114, the maximum variable amount of the phase fluctuation is determined in the phase comparison frequency range of the PLL circuit 101, thus the PLL circuit 101 for setting the input signal to a low frequency of about 32 KHz becomes necessary and the phase fluctuation amount cannot be set as desired; this is a problem.

Thus, for example, in a transmission system adapted to the 2.5-GHz bit rate in SDH (Synchronous Digital Hierarchy) defined in 0.171, 2 of ITU-T (International Telecommunication Union) Recommendation, very large wander of 57600 UI (unit interval) needs to be given to the apparatus on which measurement is to be made. However, since the maximum variable amount of the phase fluctuation is limited in the range of phase-comparable frequencies of the phase comparator 101 in the phase fluctuation generation circuit 100 comprising the PLL circuits in the related art, the amplitude of the modulated signal added to the addition circuit contained in the loop filter circuit 114 is also limited and it is difficult to generate very large wander.

SUMMARY

In general, according to one aspect, a phase fluctuation generation circuit includes a phase detection circuit for detecting a phase difference between a reference clock signal and a fed-back clock signal and outputting a phase difference signal. A conversion circuit is provided for converting the phase difference signal output from the phase detection circuit into a predetermined voltage signal. A voltage-controlled oscillation circuit outputs a clock signal of a predetermined oscillation frequency in response to a voltage value of the voltage signal output from the conversion circuit. A modulated signal generation circuit generates a modulation control signal to fluctuate a phase of the fed-back clock signal. A dividing circuit operating at clock timing of the clock signal output from the voltage-controlled oscillation circuit multiplexes the modulation control signal output from the modulated signal generation circuit and outputs the fed-back clock signal to the phase detection circuit.

Some implementations may include one or more of the following features. The dividing circuit can include a multiplexer. The modulated signal generation circuit can include a signal source for generating a sine wave signal of a predetermined amplitude at a predetermined frequency, an A/D conversion circuit for sampling the sine wave signal output from the signal source at a predetermined timing and converting the signal into a predetermined digital signal, and a bit shift circuit for converting the digital signal output from the A/D conversion circuit into a modulation control signal containing parallel bits cyclically shifted and outputting the modulation control signal. The dividing circuit can multiplex the modulation control signal containing parallel bits output from the bit shift circuit to convert the signal into a fed-back clock signal containing serial bits and swing the phase of the serial bits of the fed-back clock signal in response to the shift state of the bit string in the modulation control signal.

In another aspect, a phase fluctuation generation method comprises a phase detection step including detecting a phase difference between a reference clock signal and a fed-back clock signal and outputting a phase difference signal. A conversion step includes converting the phase difference signal output from the phase detection step into a predetermined voltage signal. A voltage-controlled oscillation step includes outputting a clock signal of a predetermined oscillation frequency in response to a voltage value of the voltage signal output from the conversion step. A modulated signal generation step includes generating a modulation control signal for fluctuating a phase of the fed-back clock signal. A dividing step includes operating at clock timing of the clock signal output from thed voltage-controlled oscillation step for multiplexing the modulation control signal output from the modulated signal generation step and outputting the fed-back clock signal.

One or more of the following advantages may be present in some implementations. A wide range of phase fluctuation can be provided to the output signal independently of the phase comparison frequency. For example, it is possible to provide very large wander to a transmission system for transmitting at a high bit rate. The phase variable amount can be set independently of the phase comparison frequency based on the reference clock signal input to the phase detection circuit, so that the division ratio of the fed-back clock signal can be set smaller than that in the PLL circuit in the related art, facilitating design of the phase fluctuation generation circuit.

Other features and advantages will be readily apparent from the following detailed description, the accompanying drawings and the claims.

DETAILED DESCRIPTION OF THE PREFERRED EMBODIMENTS

First, the configuration of a phase fluctuation generation circuit 1 will be discussed.

Figure 1:
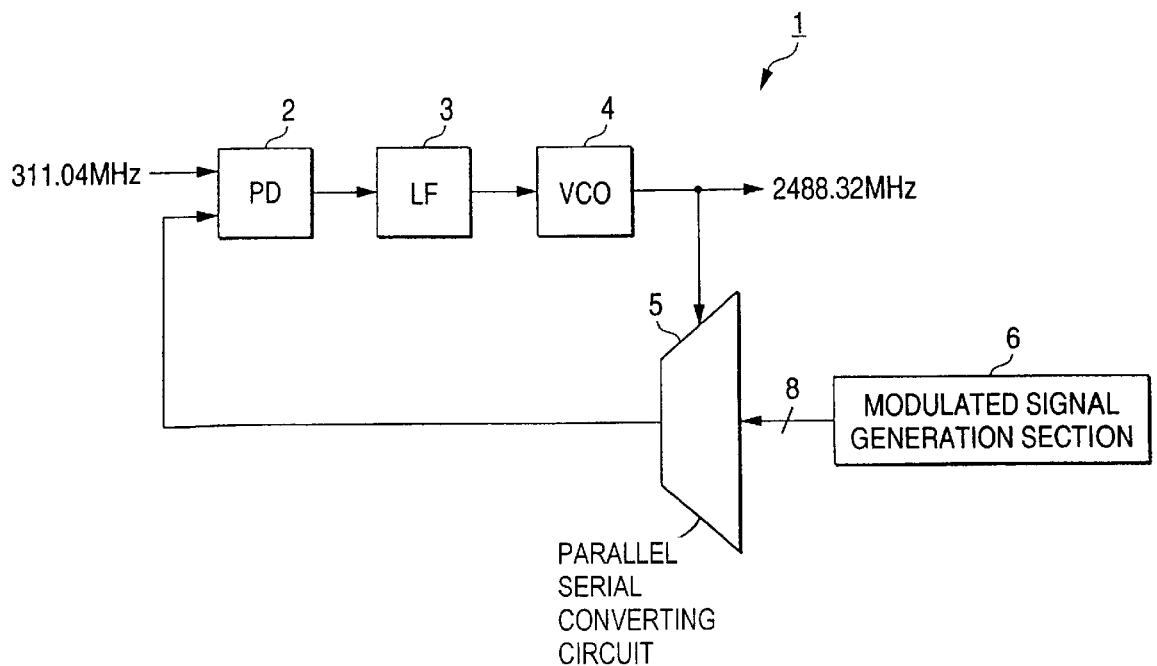
FIG. 1 is a block diagram of a phase fluctuation generation circuit 1 according to one embodiment.

FIG. 1 is a block diagram of the phase fluctuation generation circuit 1. In FIG. 1, the phase fluctuation generation circuit 1 is a PLL circuit which comprises a phase detector (PD) 2, a loop filter circuit (LF) 3, a voltage-controlled oscillator (VCO) 4, a parallel serial converting circuit 5, and a modulated signal generation section 6.

The phase detector (PD) 2 detects a phase difference between an input signal (311.04-MHz clock signal) and a phase fluctuation signal input from the parallel serial converting circuit 5 and outputs to the loop filter circuit 3 a phase difference signal of the pulse width corresponding to the phase difference.

The loop filter circuit 3 integrates the phase difference signal input from the phase detector 2 and outputs to the voltage-controlled oscillator 4 a predetermined voltage signal responsive to the phase difference.

The voltage-controlled oscillator 4 maintains the frequency of an output signal at 2488.32 MHz in response to voltage fluctuation of the voltage signal received from the loop filter circuit 3.

The parallel serial converting circuit 5 operates with the frequency of the output signal received from the voltage-controlled oscillator 4 as a reference clock, multiplexes eight-bit parallel data input from the modulated signal generation section 6 to eight-bit serial data, and outputs the serial data to the phase detector 2 as a phase fluctuation signal. That is, in the embodiment, the parallel serial converting circuit 5 is operated as a 1/8 division counter.

Figure 2:
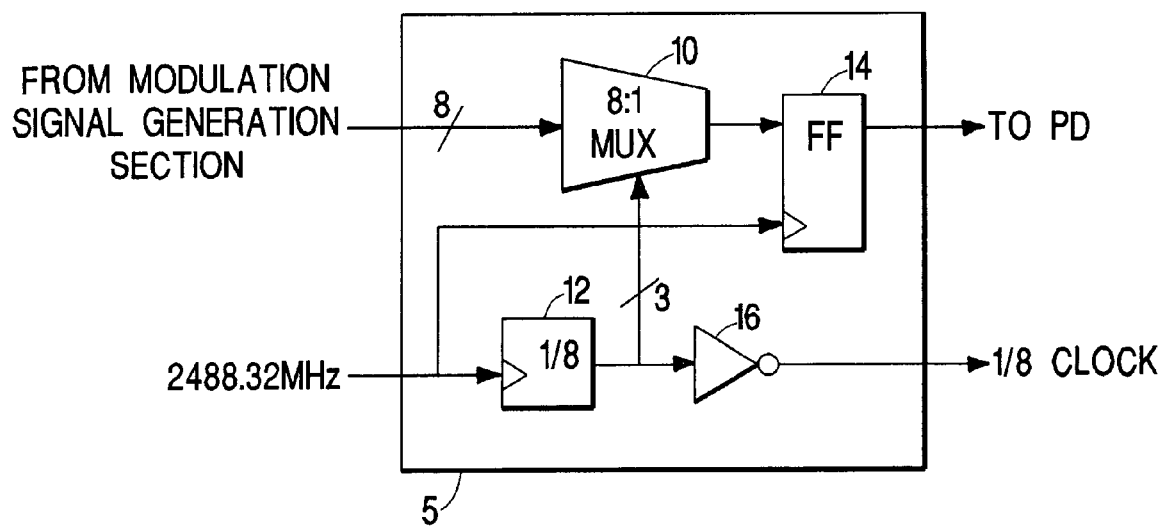
FIG. 2 is a block diagram of the parallel serial converting circuit in FIG. 1.

As illustrated in FIG. 2, the parallel serial converting circuit 5 includes an 8:1 multiplexer (MUX) 10, a 1/8 counter 12, a flip flop (FF) 14 and an inverter 16. The 1/8 counter 12 divides the 2488.32 MHz clock signal by eight and provides three selection signals to the 8:1 MUX 10. The 8:1 MUX 10 multiplexes eight modulation control signals according to the three selection signals. The multiplexed signals are re-timed by the flip-flop 14 and provided to the PD 2.

Figure 3:
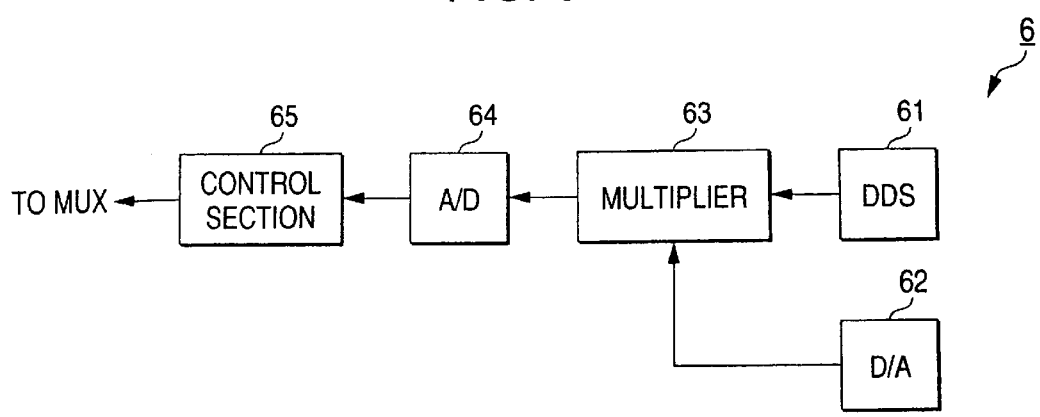
FIG. 3 is a block diagram of the modulated signal generation section 6 in FIG. 1.

As shown in FIG. 3, the modulated signal generation section 6 includes a direct digital synthesizer (DDS) 61, a digital-to-analog (D/A) converter 62, a multiplier 63, an analog-to-digital (A/D) converter 64, and a control section 65.

If a direct digital synthesizer which has a resolution of 32 bits and can operate at a (232, 106)-Hz clock is used, for example, as the DDS 61, it outputs a sine wave signal ranging from about 400 KHz of one tenth of the operation clock to 1 mHz to the multiplier 63 at a setup resolution of 1 mHz.

The D/A converter 62 generates a voltage signal for giving any desired voltage amplitude to the sine wave signal output from the DDS 61 and outputs the voltage signal to the multiplier 63.

The multiplier 63 multiplies the sine wave signal input from the DDS 61 by the voltage signal input from the D/A converter 62 and outputs the result to the A/D converter 64 as a sine wave signal of a predetermined voltage amplitude.

If an A/D converter 64 which has a resolution of 16 bits is used, for example, as the A/D converter 64, it samples the sine wave signal of a predetermined voltage amplitude input from the multiplier 63, converts the analog sine wave signal into 16-bit (65536-step) digital data, and outputs the digital data to the control section 65.

Therefore, the sine wave signal of any desired frequency and amplitude can be output from the multiplexer 63 and the digital data of any desired resolution can be input to the control section 65 depending on the specifications of the A/D converter 64.

Figure 4:
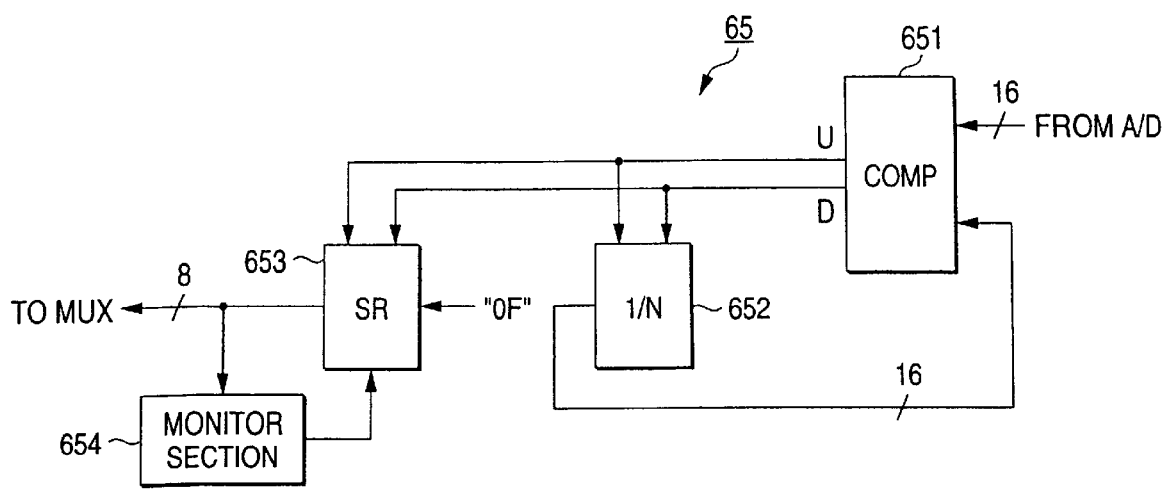
FIG. 4 is a block of the control section 65 in FIG. 3.
Figure 5:
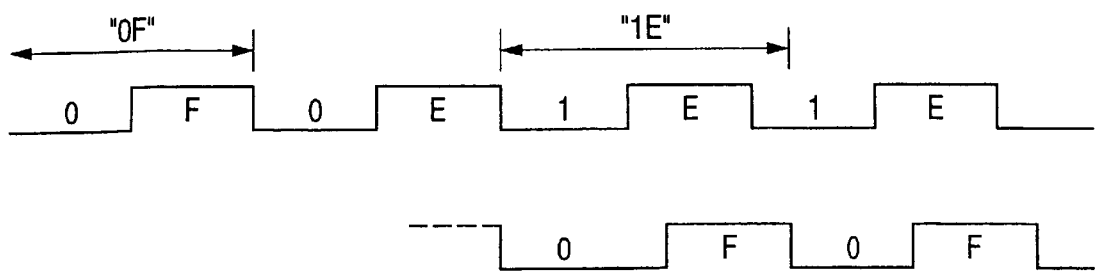
FIG. 5 shows an example of bit data output from the phase fluctuation generation circuit 1 of FIG. 1.
Figure 6:
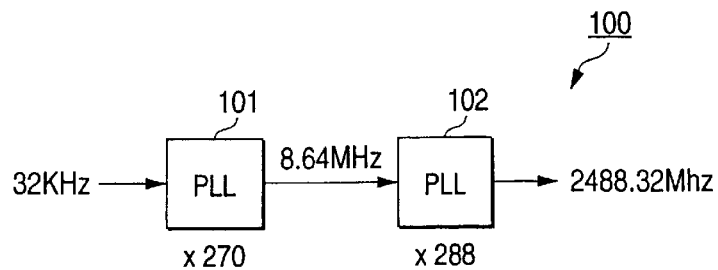
FIG. 6 is a block diagram of a phase fluctuation generation circuit in a related art.
Figure 7:
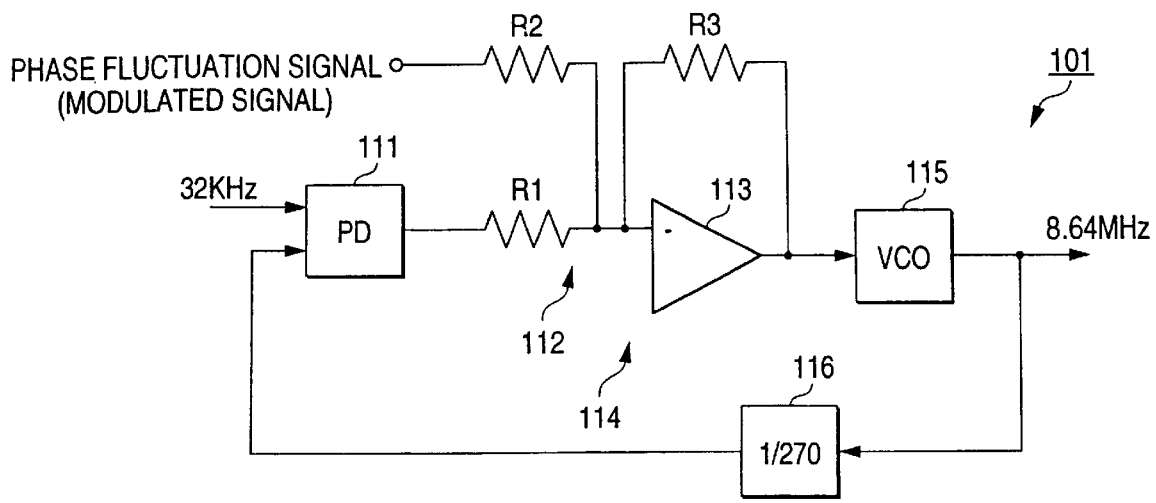
FIG. 7 is a block diagram of the PLL circuit 101 in FIG. 6.

As illustrated in FIG. 4, the control section 65 is made up of a comparator (COMP) 651, a 1/N counter 652, a shift register (SR) 653, and a monitor section 654.

The comparator 651 compares the 16-bit digital data input from the A/D converter 64 with 16-bit count data counted up or down by the 1/N counter 652 based on an up control signal (U) or a down count signal (D) output by the comparator 651. If the 16-bit data input from the A/D converter 64 is smaller than the 16-bit count data as the comparison result, the comparator 651 outputs the up control signal (U) which is high to the 1/N counter 652 and the shift register 653; if the 16-bit data input from the A/D converter 64 is larger than the 16-bit count data as the comparison result, the comparator 651 outputs the down control signal (D) which is high to the 1/N counter 652 and the shift register 653.

The 1/N counter 652, which is a 1/N (216 (65536)) up down counter, counts up and down in response to the up and down control signals input from the comparator 651 and outputs the count data to the input of the comparator 651.

The shift register 653, which is an eight-bit shift register, outputs eight-bit parallel data cyclically controlled by the up and down control signals input from the comparator 651. The output of the shift register 653 is monitored by the monitor section 654. If the eight-bit parallel output is not any of "0f," "1e," "3c," "78," "f0," "e1," "c3," or "87" in hexadecimal notation, "0F" is loaded into the shift register 653 by a load signal input from the monitor section 654. As a result, the shift register 653 outputs four successive bits 1111 and four successive bits 0000 if the most and least significant bits of the output of the shift register 653 are concatenated to form annular eight-bit data.

Therefore, if the 16-bit data output from the A/D converter 64 is smaller than the 16-bit data of the 1/N counter 652 input to the comparator 561, the comparator 561 outputs the down control signal (D) to the shift register 653. In the shift register 653, the data is rotated, for example, "0f" is changed to "1E" and "1E" is output.

The eight-bit parallel count output from the shift register 653 in the control section 65 is input to the parallel serial converting circuit 5 as a phase modulation control signal, whereby normally the parallel serial converting circuit 5 functions and operates like a 1/8 division counter. The eight-bit parallel data rotated one bit by counting up is input from the shift register 653 to the parallel serial converting circuit 5 and the division ratio becomes 1/7 only once. The parallel serial converting circuit 5 outputs a signal to the phase detector 2 as a fed-back signal with a phase lead of only one clock.

Operation of the phase fluctuation generation circuit is now described. The phase detector 2 detects a phase difference between an input signal (311.04-MHz clock signal) and a fed-back clock signal input from the parallel serial converting circuit 5. The phase detector 2 outputs a phase difference signal of the pulse width corresponding to the phase difference to the loop filter circuit 3.

The loop filter circuit 3 integrates the phase difference signal input from the phase detector 2 and outputs a predetermined voltage signal responsive to the phase difference to the voltage-controlled oscillator 4, which then maintains the frequency of an output signal at 2488.32 MHz in response to voltage fluctuation of the voltage signal input from the loop filter circuit 3.

The parallel serial converting circuit 5 operates as a 1/8 division counter with the frequency of the output signal input from the voltage-controlled oscillator 4 as a reference clock, multiplexes eight-bit parallel data input from the modulated signal generation section 6 to eight-bit serial data, and outputs the serial data to the phase detector 2 as a fed-back clock signal.

Next, in the modulated signal generation section 6, the DDS 61 outputs a sine wave signal to the multiplier 63 at a setup resolution of 1 MHz and the D/A converter 62 generates a predetermined voltage signal and outputs the voltage signal to the multiplier 63, which then multiplies the sine wave signal input from the DDS 61 by the voltage signal input from the D/A converter 62 and outputs the result to the A/D converter 64 as a sine wave signal of a predetermined voltage amplitude.

The A/D converter 64 samples the sine wave signal of a predetermined voltage amplitude input from the multiplier 63, converts the analog sine wave signal sampled at a resolution of 16 bits into digital data, and outputs the digital data to the control section 65.

In the control section 63, the comparator 651 compares the 16-bit digital data input from the A/D converter 64 with 16-bit count data counted up or down by the 1/N counter 652 based on an up control signal (U) or a down count signal (D) output by the comparator 651. If the 16-bit data input from the A/D converter 64 is smaller than the 16-bit count data as the comparison result, the comparator 651 outputs the up control signal (U) which is high to the 1/N counter 652 and the shift register 653; if the 16-bit data input from the A/D converter 64 is larger than the 16-bit count data as the comparison result, the comparator 651 outputs the down control signal (D) which is high to the 1/N counter 652 and the shift register 653.

The up or down control signal is input from the comparator 651 as a result of comparing the 16-bit data of the 1/N counter 652 with the 16-bit data of the A/D converter 64, whereby the shift register 653 outputs eight-bit parallel shift data annularly shifted in response to the up and down control signals to the parallel serial converting circuit 5.

The eight-bit parallel count output from the shift register 653 in the control section 65 is input to the parallel serial converting circuit 5 as a phase modulation control signal, whereby normally the parallel serial converting circuit 5 functions and operates like a 1/8 division counter. For example, the eight-bit parallel data rotated one bit by the up or down control signal is input from the shift register 653 to the parallel serial converting circuit 5.

If normally eight-bit data of "0F"h (consisting of four "0" bits and four "1" bits) is output, for example, as shown in FIG. 4, the most significant bit is rotated to the least significant bit temporarily as the data of "1E"h of three "0" bits, and the eight-bit parallel count is input to the parallel serial converting circuit 5 as a phase modulated signal. The parallel serial converting circuit 5 outputs a signal to the phase detector 2 as a phase fluctuation signal with the division ratio minus 1 only once, namely, with a phase lead of only one clock.

The division ratio of the phase fluctuation signal input to the phase detector 2 changes "minus one," whereby the phase detector 2 outputs a phase difference signal with a lead of one clock to the loop filter circuit 3, which then outputs a voltage signal with a lead of one clock to the voltage-controlled oscillator 4. From the voltage-controlled oscillator 4, the output signal frequency is lowered so as to correct the phase with a one-clock lead, and the phase of the fed-back clock signal is pulled back little by little. When the phase between the reference clock signal and the fed-back clock signal input to the phase detector 2 are restored to a predetermined phase, output of the voltage-controlled oscillator 4 has a one-clock lag.

Therefore, if the eight-bit parallel data of a modulated signal given by the modulated signal generation section 6 to the parallel serial converting circuit 5 is rotated consecutively, the fed-back clock signal output from the parallel serial converting circuit 5 to the phase detector 2 at a division ratio of 1/8 can be shifted consecutively, and it is possible to output the clock of the output sign al output from the voltage-controlled oscillator 4 with phase fluctuation as many clocks as desired.

Thus, the phase fluctuation generation circuit 1 can generate the division signal of the output signal input to the phase detector 2 (phase fluctuation signal) by the parallel serial converting circuit 5 and the modulated signal generation section 6 not limited to the comparison frequency range in the phase detector 6, so that the phase of the output signal can be fluctuated as desired.

In particular, the phase fluctuation generation circuit 1 makes it possible to give one-clock phase fluctuation to the output signal independently of the phase comparison frequency, whereby it is possible to give very large wander of 57600 UI (unit interval) in a transmission system adapted to the 2.5-GHz bit rate in the SDH defined in 0.171, 2 of ITU-T Recommendation.

Consequently, the division ratio of the division clock signal input to the phase detector 2 can be set smaller than that in the PLL circuit in the related art, facilitating design of the phase fluctuation generation circuit.

The frequencies of the input and output signals, the number of bits of the phase fluctuation signal, and the like set in the phase fluctuation generation circuit 1 of the embodiment are not limited, and can be changed conforming to the transmission system using the phase fluctuation generation circuit 1, needless to say.

Using the phase fluctuation generation 1, the output clock signal phase can be fluctuated as desired without being limited to the comparison frequency range in phase detection.

Also, using the phase fluctuation generation circuit, it is possible to give any desired phase fluctuation to the output signal independently of the phase comparison frequency; for example, it is made possible to give very large wander to a transmission system for transmitting at a high bit rate.

According to the phase fluctuation generation circuit, the phase variable amount can be set independently of the phase comparison frequency based on the reference clock signal input to the phase detection circuit, so that the division ratio of the fed-back clock signal can be set smaller than that in the PLL circuit in the related art, facilitating design of the phase fluctuation generation circuit.

What is claimed is:

1. A phase fluctuation generation circuit comprising:
    a phase detection circuit for detecting a phase difference between a reference clock signal and a fed-back clock signal and outputting a phase difference signal;
    a conversion circuit for converting the phase difference signal output from said phase detection circuit into a predetermined voltage signal;
    a voltage-controlled oscillation circuit for outputting a clock signal of a predetermined oscillation frequency in response to a voltage value of the voltage signal output from said conversion circuit;
    a modulated signal generation circuit for generating a modulation control signal to fluctuate a phase of the fed-back clock signal; and
    a dividing circuit operating at clock timing of the clock signal output from said voltage-controlled oscillation circuit for multiplexing the modulation control signal output from said modulated signal generation circuit and outputting the fed-back clock signal to said phase detection circuit.

2. The phase fluctuation generation circuit as claimed in claim 1 wherein said modulated signal generation circuit comprises:
    a signal source for generating a sine wave signal of a predetermined amplitude at a predetermined frequency;
    an A/D conversion circuit for sampling the sine wave signal output from the signal source at a predetermined timing and converting the signal into a predetermined digital signal; and
    a bit shift circuit for converting the digital signal output from the A/D conversion circuit into a modulation control signal containing parallel bits cyclically shifted and outputting the modulation control signal, and
    wherein said dividing circuit multiplexes the modulation control signal containing parallel bits output from the bit shift circuit to convert the signal into a fed-back clock signal containing serial bits and swings phase of the serial bits of the fed-back clock signal in response to the shift state of the bit string in the modulation control signal.

3. The phase fluctuation generation circuit as claimed in claim 1 wherein said dividing circuit comprises a multiplexer.

4. A phase fluctuation generation method comprising:
    a phase detection step including detecting a phase difference between a reference clock signal and a fed-back clock signal and outputting a phase difference signal;
    a conversion step including converting the phase difference signal output from said phase detection step into a predetermined voltage signal;
    a voltage-controlled oscillation step including outputting a clock signal of a predetermined oscillation frequency in response to a voltage value of the voltage signal output from said conversion step;
    a modulated signal generation step including generating a modulation control signal for fluctuating a phase of the fed-back clock signal; and
    a dividing step including operating at clock timing of the clock signal output from said voltage-controlled oscillation step for multiplexing the modulation control signal output from said modulated signal generation step and outputting the fed-back clock signal.

5. The phase fluctuation generation method as claimed in claim 4 wherein said modulated signal generation step comprises:
    a signal generation step including generating a sine wave signal of a predetermined amplitude at a predetermined frequency;
    a A/D conversion step including sampling the sine wave signal output from the signal generation step at a predetermined timing and converting the signal into a predetermined digital signal; and a bit shift step including converting the digital signal output from the A/D conversion step into a modulation control signal containing parallel bits cyclically shifted and outputting the modulation control signal, wherein said dividing step multiplexes the modulation control signal containing parallel bits output from the bit shift step to convert the signal into a fed-back clock signal containing serial bits and swings phase of the serial bits of the fed-back clock signal in response to the shift state of the bit string in the modulation control signal.

* * * * *